United States Patent
Tsukidate et al.

(10) Patent No.: US 11,799,598 B2
(45) Date of Patent: Oct. 24, 2023

(54) VEHICLE CONTROL DEVICE AND CONTROL METHOD THEREOF

(71) Applicant: Hitachi Automotive Systems, Ltd., Hitachinaka (JP)

(72) Inventors: Tsunamichi Tsukidate, Tokyo (JP); Tomohito Ebina, Ibaraki (JP); Kazuyoshi Serizawa, Ibaraki (JP); Kosei Goto, Ibaraki (JP)

(73) Assignee: HITACHI ASTEMO, LTD., Hitachinaka (JP)

(*) Notice: Subject to any disclaimer, the term of this patent is extended or adjusted under 35 U.S.C. 154(b) by 511 days.

(21) Appl. No.: 16/967,171

(22) PCT Filed: Mar. 6, 2019

(86) PCT No.: PCT/JP2019/008758
§ 371 (c)(1),
(2) Date: Aug. 4, 2020

(87) PCT Pub. No.: WO2019/181490
PCT Pub. Date: Sep. 26, 2019

(65) Prior Publication Data
US 2021/0036814 A1 Feb. 4, 2021

(30) Foreign Application Priority Data
Mar. 20, 2018 (JP) ................. 2018-052353

(51) Int. Cl.
*H04L 1/20* (2006.01)
*B60R 16/023* (2006.01)
(Continued)

(52) U.S. Cl.
CPC .......... *H04L 1/205* (2013.01); *B60R 16/0231* (2013.01); *G01R 29/26* (2013.01); *G01R 31/31709* (2013.01)

(58) Field of Classification Search
CPC .................................................... H04L 1/205
(Continued)

(56) References Cited

U.S. PATENT DOCUMENTS

| 6,078,998 A | 6/2000 | Kamel et al. |
| 6,757,608 B2 * | 6/2004 | Gross .......... H04L 12/403 |
| | | 700/27 |

(Continued)

FOREIGN PATENT DOCUMENTS

| EP | 0 553 588 A2 | 8/1993 |
| EP | 3 037 303 A1 | 6/2016 |

(Continued)

OTHER PUBLICATIONS

International Search Report with English translation and Written Opinion issued in corresponding application No. PCT/JP2019/008758 dated Jul. 2, 2019.

(Continued)

*Primary Examiner* — Ricky Go
(74) *Attorney, Agent, or Firm* — Foley & Lardner LLP

(57) ABSTRACT

There are provided a vehicle control device and a control method thereof capable of improving safety and reliability with a simple configuration. A vehicle control device 1 that controls a vehicle includes an execution management unit P3 that manages execution of predetermined processing, an execution state recording unit P5 that records a history of execution states of the predetermined processing, and a setting information management unit P4 that manages setting information related to the execution of the predetermined processing. The setting information includes a jitter tolerance which is a tolerance of a jitter. The execution management unit P3 adjusts an execution timing of processing to be adjusted, which is included in the predetermined (Continued)

processing and in which the jitter is generated, based on the jitter tolerance of the processing to be adjusted.

8 Claims, 12 Drawing Sheets

(51) Int. Cl.
*G01R 29/26* (2006.01)
*G01R 31/317* (2006.01)

(58) Field of Classification Search
USPC .......................................................... 702/69
See application file for complete search history.

(56) References Cited

U.S. PATENT DOCUMENTS

| | | | |
|---|---|---|---|
| 8,706,265 | B2 | 4/2014 | Taira |
| 9,082,239 | B2* | 7/2015 | Ricci ..................... G06F 16/25 |
| 9,088,399 | B1 | 7/2015 | Poon et al. |
| 10,741,143 | B2* | 8/2020 | Dimitrov ............... G09G 5/395 |
| 2004/0255296 | A1 | 12/2004 | Schmidt |
| 2014/0181833 | A1 | 6/2014 | Bird et al. |
| 2014/0309789 | A1* | 10/2014 | Ricci ....................... G06F 16/25 |
| | | | 700/276 |

FOREIGN PATENT DOCUMENTS

| | | |
|---|---|---|
| JP | 2006-235907 A | 9/2006 |
| JP | 5136695 B2 | 2/2013 |

OTHER PUBLICATIONS

V. K. Kukkala et al., "JAMS: Jitter-Aware message Scheduling for FlexRay Automotive Networks: Special Session Paper", 2017 Eleventh IEEE/ACM International Symposium on Networks-on-Chip (NOCS), Oct. 2017, 7 pages.

Extended European Search Report issued in corresponding European Patent Application No. 19772291.1 dated Nov. 9, 2021.

* cited by examiner

FIG. 3

TIMER MANAGEMENT TABLE (401)

| NAME (4011) | VALUE (4012) |
|---|---|
| TIMER COUNTER | |
| MAXIMUM TIMER COUNTER | |

FIG. 4

PROCESSING INFORMATION MANAGEMENT TABLE (402)

| NAME (4021) | PRIORITY (4022) | EXECUTION PERIOD (4023) | MAXIMUM EXECUTION INTERVAL (4024) | JITTER TOLERANCE (4025) | QUEUE PRIORITY (4026) | QUEUE ORDER (4027) |
|---|---|---|---|---|---|---|
| ISR | | | | | | |
| : | | | | | | |
| Task A | | | | | | |
| Task B | | | | | | |
| Task C | | | | | | |
| : | | | | | | |

FIG. 5

PROCESSING LOG RECORDING MANAGEMENT TABLE (TASK T2) — 403
PROCESSING LOG RECORDING MANAGEMENT TABLE (TASK T1) — 403

| ID 4031 | EXECUTION TIME 4032 | END TIME 4033 | EXECUTION INTERVAL 4034 | AVERAGE EXECUTION INTERVAL 4035 | ... |
|---|---|---|---|---|---|
| 1 | 0 |  | — | — |  |
| 2 |  |  |  |  |  |
| 3 |  |  |  |  |  |
| 4 |  |  |  |  |  |
| ... |  |  |  |  |  |

FIG. 6

OFFSET ADJUSTMENT TABLE — 404

| NAME 4041 | EXECUTION STATE 4042 | OFFSET 4043 | EXECUTION TIMING ADJUSTMENT VALUE 4044 | OFFSET FLAG 4045 | REPLACEMENT FLAG 4046 |
|---|---|---|---|---|---|
| Task A | 0/1/2 UNEXECUTED WAITING EXECUTED |  |  |  |  |
| Task B |  |  |  |  |  |
|  |  |  |  |  |  |

VEHICLE CONTROL DEVICE AND CONTROL METHOD THEREOF

TECHNICAL FIELD

The present invention relates to a vehicle control device and a control method thereof.

BACKGROUND ART

A vehicle control system includes ECUs that operates electronic vehicle control devices, that is, electronic control units, and an in-vehicle local area network (LAN) that enables communication between a plurality of ECUs. With a reduction in environmental load and demand for safety, the performance of the vehicle control system has become high and the functions thereof have been decentralized and complicated. As a result, the importance of standardization of a software architecture of the ECU, electronic control of a safety device, and a mechanism for ensuring the safety thereof has increased.

As the electronic control of the safety device in the vehicle control device has advanced, only a mechanism for functional safety has been introduced into the vehicle control system. The functional safety is an idea of ensuring safety by causing electric and electronic systems to transition to a safe side when a failure occurs in the systems. For example, Automotive Safety Integrity Level (ASIL) which is a standard safety level is provided in the functional safety standard ISO26262 for vehicles.

In order to comply with the highest level ASIL_D, it is necessary to prove to a third party that configurations of safety-related functions of the vehicle control device are clearly separated from the main functions, safety devices, and monitoring devices.

When the functional safety standard ISO26262 is applied to a general vehicle control device, it is predicted that various ASIL software will coexist in the vehicle control system. Thus, in order for existing software to comply with the functional safety standard, a mechanism for preventing interference between the software and a technology for increasing a speed, reducing a weight, and improving reliability of processing related to the mechanism are required.

A time protection function, a memory protection function, and a data protection function are known as mechanisms for preventing interaction between software constituting the system. For example, even though quality management (QM) software with a low safety level is out of control, there is a mechanism that suppresses the inhibition of an operation of software with high safety level such as ASIL_D software and prevents influence on the system.

In PTL 1, the execution timing is guaranteed by providing dedicated partitioning, and thus, the system is prevented from being influenced by processing with different security levels.

CITATION LIST

Patent Literature

PTL 1: JP 5136695 B

SUMMARY OF INVENTION

Technical Problem

In a system in which software of various suppliers and original equipment manufacturers (OEMs) coexist, the suppliers need to design software with limited information. However, a deviation (jitter) is generated in an execution timing interval of control processing assigned by the supplier by unintended high-priority processing from OEM software or third-party software, and thus, there is a possibility that the control become unstable. In PTL 1, a time zone in which a task is executed is decided for each company by using time-division scheduling. However, in the method of PTL 1, since a time slot is small, the design becomes complicated, and overhead becomes large.

The present invention has been made in view of the above problems, and an object of the present invention is to provide a vehicle control device and a control method thereof capable of improving safety and reliability with a simple configuration. Another object of the present invention is to provide a vehicle control device and a control method thereof capable of suppressing influence of a jitter by using a tolerance of the jitter set for predetermined processing.

Solution to Problem

In order to solve the above problems, a vehicle control device according to the present invention is a vehicle control device that controls a vehicle. The device includes an execution management unit that manages execution of predetermined processing, an execution state recording unit that records a history of execution states of the predetermined processing, and a setting information management unit that manages setting information related to the execution of the predetermined processing. The setting information includes a jitter tolerance which is a tolerance of a jitter. The execution management unit adjusts an execution timing of processing to be adjusted, which is included in the predetermined processing and in which the jitter is generated, based on the jitter tolerance of the processing to be adjusted.

Advantageous Effects of Invention

According to the present invention, it is possible to adjust the execution timing of the processing to be adjusted in which the jitter is generated based on the jitter tolerance of the processing to be adjusted.

BRIEF DESCRIPTION OF DRAWINGS

FIG. 3 is a diagram illustrating an example of a timer management table.

FIG. 4 is a diagram illustrating an example of a processing information management table.

FIG. 5 is a diagram illustrating an example of a processing log recording management table.

FIG. 6 is a diagram illustrating an example of an offset adjustment table.

DESCRIPTION OF EMBODIMENTS

Hereinafter, embodiments of the present invention will be described with reference to the drawings. In a vehicle control device and a control method thereof according to the present embodiment, an execution timing of a high-priority task or a task of which an execution timing deviates by interrupt processing is adjusted by using a jitter tolerance. Accordingly, in the present embodiment, it is possible to reduce the deviation in the execution timing of the processing (task) managed by an operating system (OS) of the vehicle control device with a simple control configuration.

The vehicle control device according to the present embodiment includes a software control unit that manages execution timings, execution orders, and execution states of plurality of predetermined processing (including task processing and interrupt processing), an execution state recording unit that records a history of the execution states (execution timings, execution times, and execution states) of the processing, and a setting information storage unit that stores setting information (execution period, minimum and maximum execution intervals, execution times, and deadlines) related to the processing. The setting information management unit can manage a jitter tolerance degree indicating a degree of tolerance of a deviation (hereinafter, referred to as a jitter) of the processing from expected setting information, a deviation from the execution interval, or a deviation from the execution time. The software control unit refers the jitter tolerance degree, and adjusts processing executed at a timing deviated from a predetermined period at a next activation timing according to the jitter tolerance degree.

The execution timing of the processing can be temporarily or permanently changed according to the type of the jitter by determining whether the jitter is executed periodically or is executed temporarily.

The execution timing can be replaced with an execution timing of another processing within the same execution period according to the jitter and the execution timing.

First Embodiment

Figure 1:
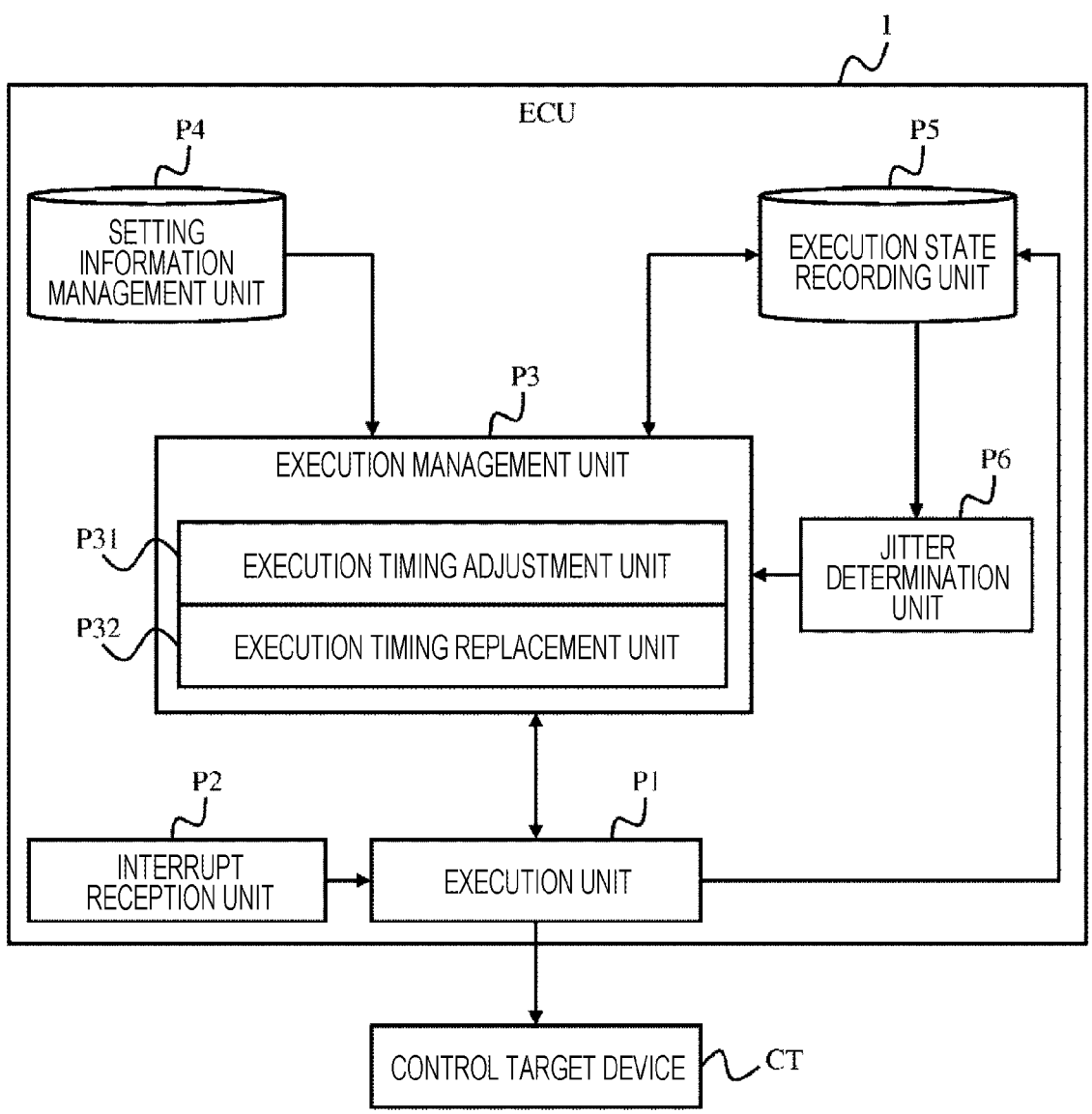
FIG. 1 is a functional configuration diagram of an ECU as a vehicle control device.

An embodiment will be described with reference to FIGS. 1 to 16. FIG. 1 is an explanatory diagram illustrating a functional configuration of an ECU 1 as an example of the "vehicle control device". In the present embodiment, the ECU 1 that controls an inverter is described as an example, but the present invention can also be applied to an ECU that controls a control target other than the inverter.

The ECU 1 is an electronic control unit that controls a control target device CT such as an inverter. As will be described below, the ECU 1 has functions such as an execution unit P1, an interrupt reception unit P2, an execution management unit P3, a setting information management unit P4, an execution state recording unit P5, and a jitter determination unit P6.

The execution unit P1 has a function of executing task processing or interrupt processing. Hereinafter, the task processing may be abbreviated as "task", and the interrupt processing may be abbreviated as an "interrupt". "Predetermined processing" includes both the task processing and the interrupt processing.

The execution unit P1 executes tasks stored in an execution queue in descending order of priority according to the execution timing managed by the execution management unit P3. When the interrupt reception unit P2 receives the interrupt, the execution unit P1 temporarily suspends the execution of the task, and executes the received interrupt processing. The execution of the interrupted task is resumed after the end of the interrupt processing.

The execution management unit P3 has a function of managing the execution of the task processing and the interrupt processing. Specifically, the execution management unit P3 can manage an execution timing, an execution order, and an execution state of the task processing and the interrupt processing.

The execution management unit P3 includes an execution timing adjustment unit P31 and an execution timing replacement unit P32. The execution timing adjustment unit P32 has a function of adjusting the execution timing of the task processing to be adjusted based on the jitter tolerance based on the determination result of the jitter determination unit P6. The execution timing replacement unit P32 replaces the execution timing of the task processing to be adjusted with an execution timing of another task processing according to a jitter generated in the task processing to be adjusted and the execution timing. That is, order in the execution queue is changed.

The setting information management unit P4 has a function of managing setting information related to the execution of the task processing and the interrupt processing. Setting information includes an allowable value of the jitter (hereinafter, also referred to as a jitter tolerance). The setting information can also include information such as priority, an execution period, a maximum execution interval, queue priority, and a queue order.

The execution state recording unit P5 has a function of recording a history of execution states of the task processing and the interrupt processing. The execution state recording unit P5 records information such as an execution time, an end time, an execution interval, and an average execution interval.

The jitter determination unit P6 has a function of determining whether the jitter generated in the processing to be adjusted is a periodic jitter generated periodically or a temporary jitter generated temporarily.

The execution timing adjustment unit P31 of the execution management unit P3 adjusts the execution timing of the processing to be adjusted based on the jitter tolerance based on the determination result of the jitter determination unit. When the jitter determination unit P6 determines that the jitter generated in the processing to be adjusted is the periodic jitter, the execution timing adjustment unit P31 adjusts the execution timing of the processing to be adjusted in correlation with the periodic jitter.

The execution timing replacement unit P32 of the execution management unit P3 replaces the next execution timing of the task processing to be adjusted with an execution timing of another processing of the predetermined processing according to the jitter generated in the processing to be adjusted and the execution timing of the processing to be adjusted.

Figure 2:
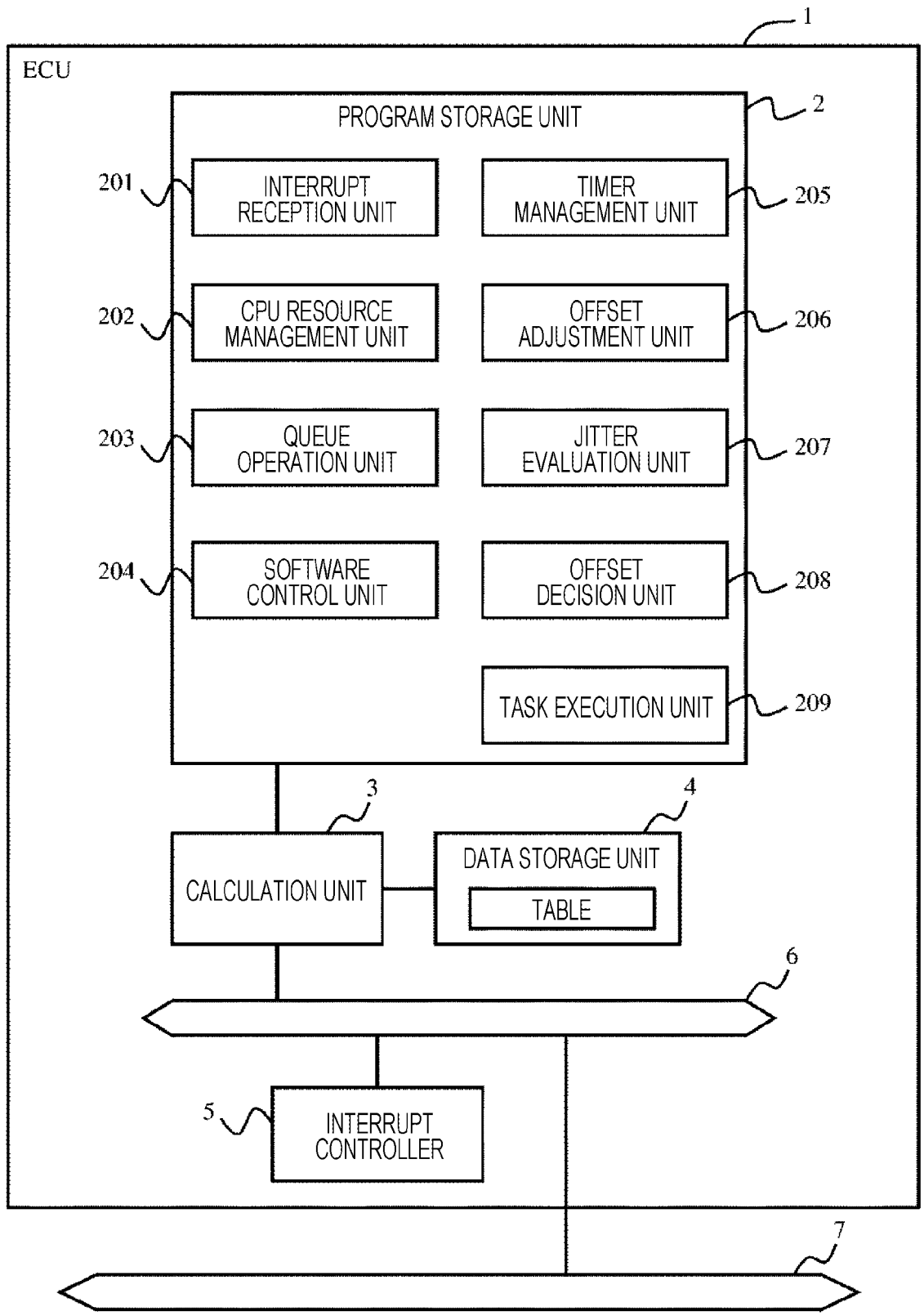
FIG. 2 is a diagram illustrating a hardware configuration and a software configuration of the ECU.

FIG. 2 illustrates an outline of a hardware configuration and a software configuration of the ECU 1. Although the ECU 1 is used for the inverter control device, the present invention is not limited thereto, and may also be applied to other control target ECUs.

The ECU 1 includes, for example, a program storage unit 2, a calculation unit 3, a data storage unit 4, an interrupt controller 5, and an internal bus 6.

The calculation unit 3 is a processor core (CPU: Central Processing Unit) that executes a computer program stored in the program storage unit 2.

The program storage unit 2 is a storage device that stores the computer program. The program storage unit 2 includes, for example, an interrupt reception unit 201, a CPU resource management unit 202, a queue operation unit 203, a software control unit 204, a timer management unit 205, an offset adjustment unit 206, a jitter evaluation unit 207, an offset decision unit 208, and a task execution unit 209.

The interrupt reception unit 201 is a computer program that receives interrupt processing from an ECU (not illustrated). The interrupt reception unit 201 corresponds to the interrupt reception unit P2 of FIG. 1. The CPU resource management unit 202 is a computer program that manages calculation resources of the calculation unit (CPU) 3. The queue operation unit 203 is a computer program that operates the order of tasks stored in the queue. The queue operation unit 203 corresponds to the execution timing replacement unit P32 of FIG. 1.

The software control unit 204 is a computer program that manages the execution of the task processing and the interrupt processing. The software control unit 204 corresponds to the execution management unit P3 of FIG. 1. The timer management unit 205 is a computer program that manages timer information.

The offset adjustment unit 206 is a computer program that adjusts a time (offset) at which the execution timing of the task processing deviates. The offset adjustment unit 206 corresponds to the execution timing adjustment unit P31 of FIG. 1.

The jitter evaluation unit 207 is a computer program that determines whether the generated jitter is the periodic jitter or the temporary jitter. The jitter evaluation unit 207 corresponds to the jitter determination unit P6 of FIG. 1.

The offset decision unit 208 is a computer program used by the offset adjustment unit 206, and decides an offset. The offset decision unit 208 corresponds to the execution timing adjustment unit P31 of FIG. 1 together with the offset adjustment unit 206. The task execution unit 209 is a computer program that executes the task extracted from the queue. The task execution unit 209 corresponds to the execution unit P1 of FIG. 1.

The function of the ECU according to the present invention is realized by the calculation unit 3 reading and executing the computer program stored in the program storage unit 2.

The data storage unit 4 is a storage device that stores, for example, a timer management table 401 to be described below in FIG. 3, a processing information management table 402 to be described below in FIG. 4, a processing log recording management table 403 to be described below in FIG. 5, an offset adjustment table 404 to be described below in FIG. 6, and a queue management table 405 to be described below in FIG. 7.

When a non-maskable signal is received from a hardware timer, the interrupt controller 5 interrupts the processing being executed by the calculation unit, and generates an interrupt that cannot be masked (non-maskable interrupt).

The ECU 1 according to the present embodiment is not limited to the configuration illustrated in FIG. 2. For example, a nonvolatile memory (backup RAM) for storing data, a shared memory shared by a plurality of calculation units 3, and a sensor (not illustrated) may be provided.

FIG. 3 illustrates an example of the timer management table 401. The timer management table 401 that manages time information includes, for example, a name field 4011 and a value field 4012. The name field 4011 is a name of a target managed in the timer management table 401. In the name field 4011, for example, a timer counter and a maximum timer counter (maximum value of the timer counter) are set, but the type and number of targets managed in the timer management table 401 and a management method are not limited to the aforementioned examples. The value field 4012 indicates a value of the target managed in the timer management table 401.

FIG. 4 illustrates an example of the processing information management table 402 that manages information related to the execution of the task processing and the interrupt processing. The processing information management table 402 corresponds to the "setting information management unit P4" of FIG. 1. The processing information management table 402 includes, for example, a name field 4021, a priority field 4022, an execution period field 4023, a maximum execution interval field 4024, a jitter tolerance field 4025, a queue priority field 4026, and a queue order 4027.

The name field 4021 is a name of the processing (identification information of the task processing and identification information of the interrupt processing) managed by the processing information management table 402. In the present embodiment, the interrupt processing and the task processing are managed, but the type and number of targets to be managed and the management method are not limited to the example illustrated in FIG. 4.

The priority field 4022 stores the priority of the processing managed in the name field 4021. In the present embodiment, 16 levels of priority are adopted. "1" is set for the highest priority, and "16" is set for the lowest priority. The priority may be managed in the number of levels lower than 16 or in the number of levels more than 16. The execution period field 4023 stores an execution period of the processing managed in the name field 4021. In the present embodiment, the execution period is a period of 1 to 10 ms in the processing and the interrupt. The maximum execution interval field 4024 stores a maximum value of an interval from when the processing managed in the name field 4021 is executed to when the processing is executed next. In the present embodiment, only the maximum execution interval is used, but the present invention is not limited thereto. For example, a minimum execution interval may be defined. The jitter tolerance field 4025 is a deviation (hereinafter, a jitter) from the setting information expected in the execution period field 4023. In the present embodiment, the jitter tolerance indicates a degree of allowance of a deviation from the execution interval, but is not limited thereto. For example, the jitter tolerance may be a degree of allowance of a deviation between the execution time and the minimum execution interval. The queue priority field 4026 indicates the priority when the queue of the calculation unit 3 is clogged. The queue order field 4027 includes the order of the queue in which the processing performed by the calculation unit 3 is stored. In the present embodiment, the order is from 1 to the number of processing. When the queue is clogged at the same timing, the smaller value is set in the queue first, but the present invention is not limited thereto.

FIG. 5 illustrates a processing log recording management table 403 as an example of the "execution state recording unit".

The processing log recording management table 403 corresponds to the execution state recording unit P5 of FIG. 1. In the present embodiment, the processing log recording management table 403 is prepared only for a target to be recorded.

The processing log recording management table 403 includes, for example, an ID field 4031, an execution time field 4032, an end time field 4033, an execution interval field 4034, and an average execution interval field 4035.

The ID field 4031 is an identifier for identifying a value recorded by the processing log recording management table 403. The execution time field 4032 is a value that records a timing at which the processing to be recorded is executed. The end time field 4033 is a value that records a timing at which the processing to be recorded ends. The execution interval field 4034 indicates a time elapsed from the previous execution timing of the processing to be recorded. The average execution interval field 4035 is an average execution interval of the processing to be recorded. As a value of the average execution interval, an average of all the processing may be adopted, or an average value of the execution intervals within a predetermined time may be adopted.

FIG. 6 illustrates an example of the offset adjustment table 404 for adjusting the offset. The offset adjustment table 404 includes, for example, a name field 4041, an execution state field 4042, an offset field 4043, an execution timing adjustment value field 4044, an offset flag 4045, and a replacement flag field 4046.

The name field 4041 stores information for identifying the task processing.

In the execution state field 4042, a flag for identifying the execution state of the task processing is set. In the execution state field 4042, for example, as a flag value, "0" is set when the task processing is not executed, "1" is set when the task processing is waiting, and "2" is set when the execution thereof is completed. An offset flag and a replacement flag will be described below.

Figure 7:
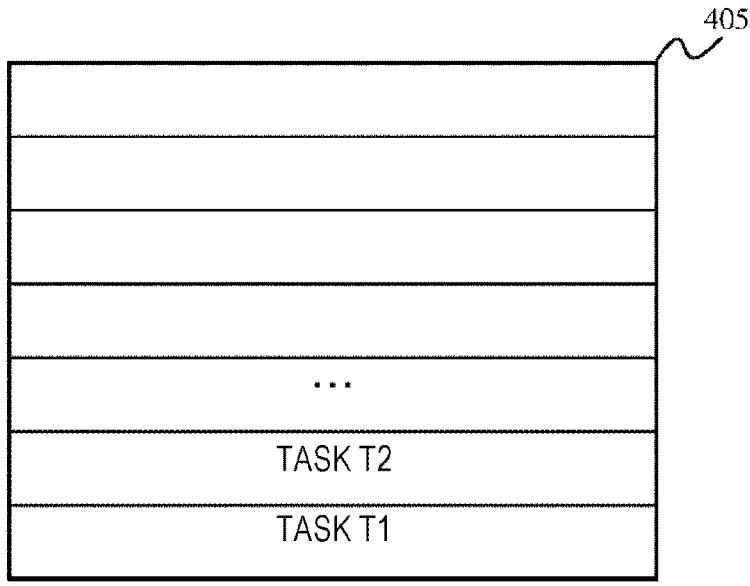
FIG. 7 is a diagram illustrating an example of a queue management table.

FIG. 7 illustrates an example of the queue management table 405 for managing the use order of the calculation resources (CPU). The queue management table 405 is a table for managing the queue of the processing executed by the calculation unit 3. In the present embodiment, new task processing is added to an upper part of the table 405, and the calculation unit 3 executes the task processing from the lowermost part of the table 405.

The aforementioned tables are examples of the tables stored in the data storage unit 4 of the ECU 1. A storage destination of the tables is not limited to the data storage unit 4. The tables may be stored in another storage device (not illustrated).

Next, an operation flow of the computer program executed by the calculation unit 3 of the ECU 1 will be described.

Figure 8:
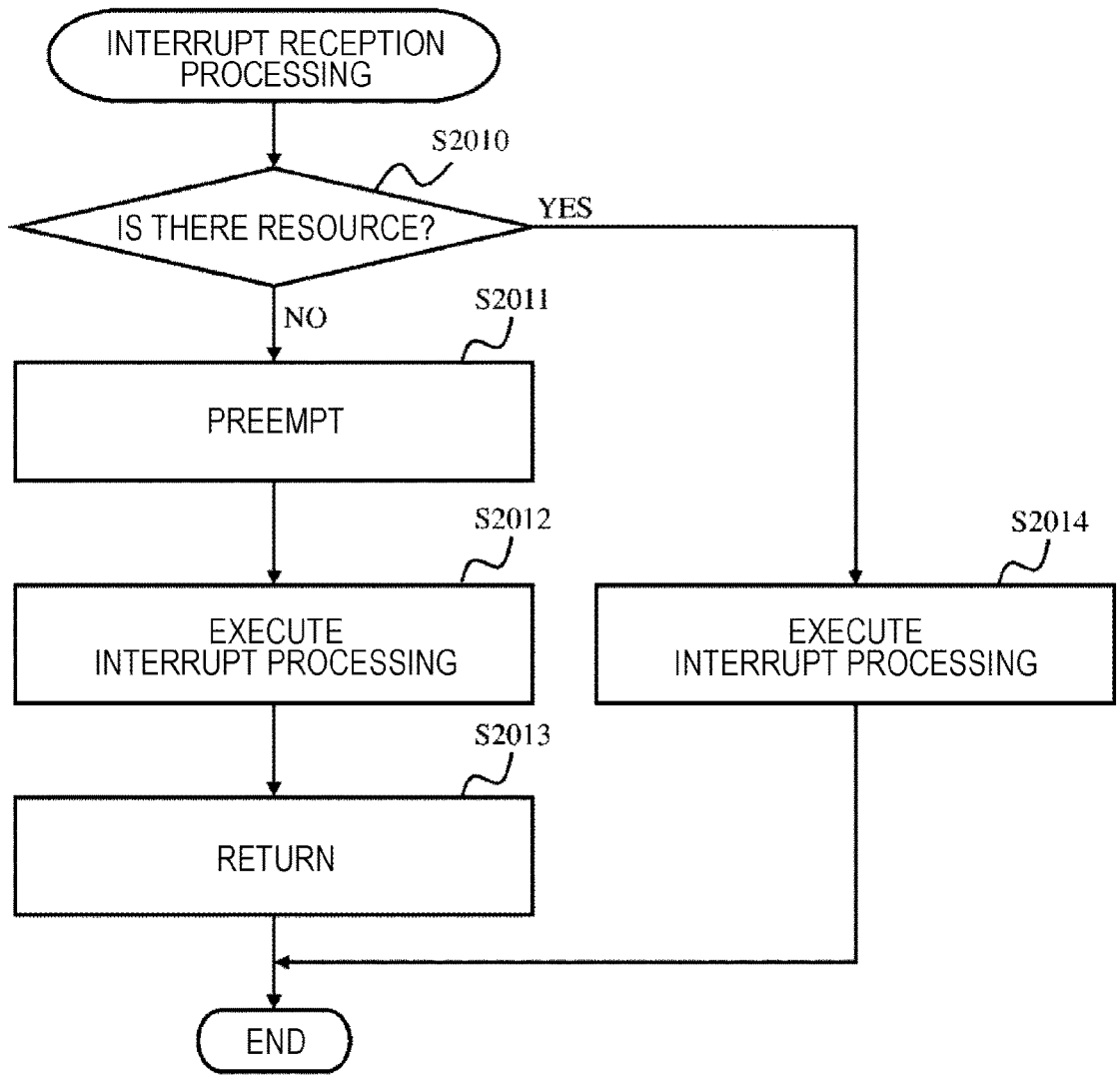
FIG. 8 is a diagram illustrating an example of an operation flow of an interrupt reception unit.

FIG. 8 is an operation flow of the interrupt reception unit 201. Hereinafter, the operation flow of FIG. 8 starts when the interrupt reception unit 201 receives the interrupt.

The interrupt reception unit 201 checks the resources of the calculation unit 3, and determines whether there is an available resource (S2010). When there is the available resource of the calculation unit 3 (S2010: YES), the interrupt reception unit 201 proceeds to step S2014. When there is no available resource (S2010: NO), the interrupt reception unit 201 proceeds to step S2011.

When it is determined that there is no available resource (S2010: NO), the interrupt reception unit 201 saves the processing content currently being executed by the calculation unit 3 (S2011). The target to be saved includes, for example, a program counter and a stack.

The interrupt reception unit 201 executes the received interrupt processing (S2012), and proceeds to step S2013. After the end of the interrupt processing, the interrupt reception unit 201 returns the processing content saved in step S2011 (S2013), and ends the processing illustrated in FIG. 8.

Meanwhile, when the interrupt is received and there is the available resource (S2010: YES), the interrupt reception unit 201 executes the interruption processing (S2014). After the end of the interrupt processing, the processing illustrated in FIG. 8 ends.

Figure 9:
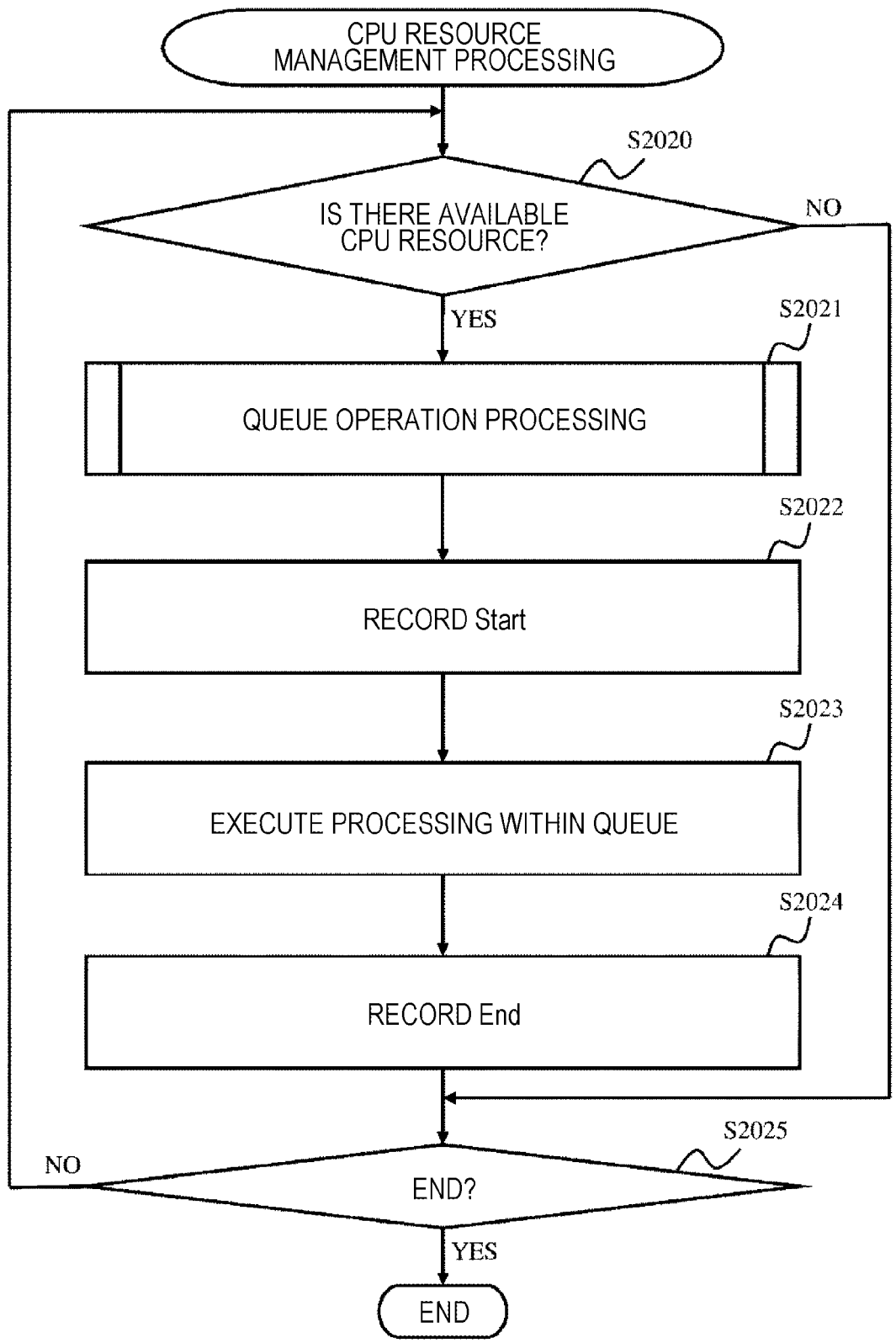
FIG. 9 is a diagram illustrating an example of an operation flow of a CPU resource management unit.

FIG. 9 is an operation flow of the CPU resource management unit 202. The CPU resource management unit 202 determines whether there is the available resource of the calculation unit 3 (S2020). The CPU resource management unit 202 proceeds to step S2021 when there is the available resource (S2020: YES), and proceeds to step S2025 when there is no available resource (S2020: NO).

Figure 10:
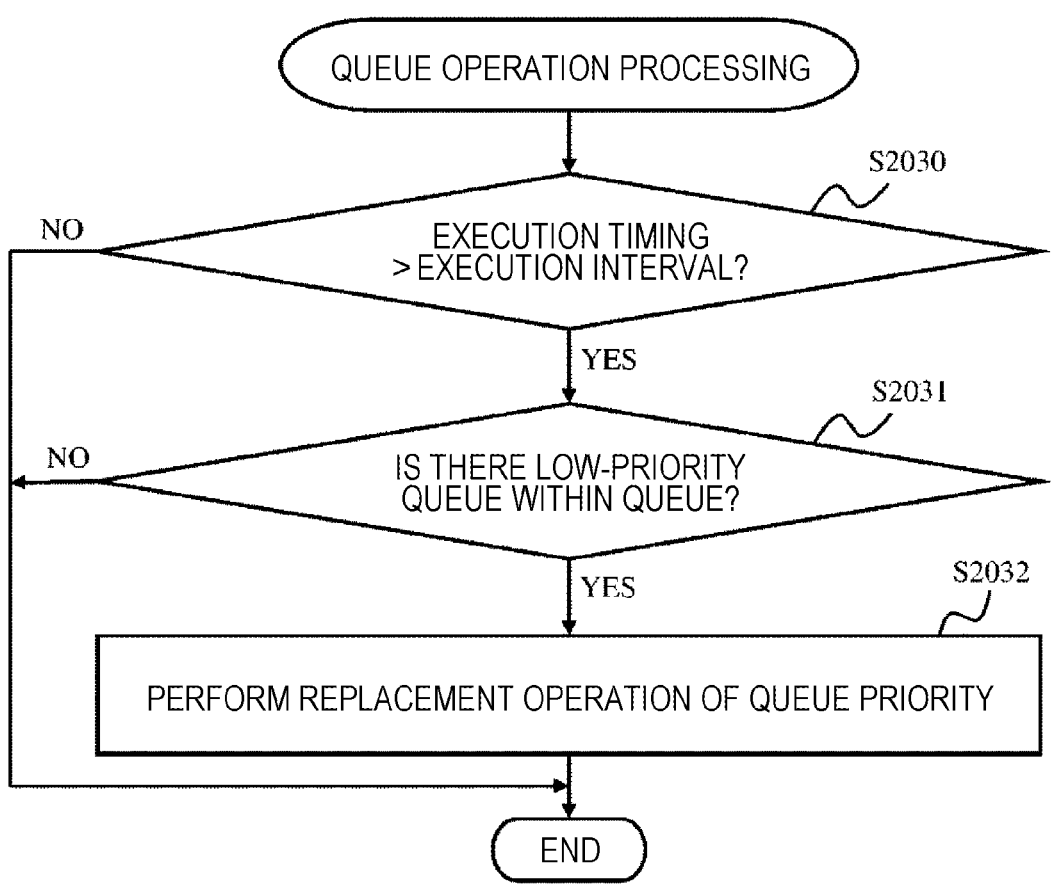
FIG. 10 is a diagram illustrating an example of an operation flow of a queue operation unit.

After the queue operation unit 203 to be described below in FIG. 10 is called (S2021), the CPU resource management unit 202 proceeds to step S2022.

The CPU resource management unit 202 records a start time ("Start" in the diagram) of the processing received by the calculation unit 3 in the execution time field 4032 of the processing log recording management table 403 (S2022), and proceeds to step S2023.

The CPU resource management unit 202 extracts the received processing from the queue, executes the processing (S2023), and proceeds to step S2024.

The CPU resource management unit 202 records an end time ("End" in the diagram) of the processing received by the calculation unit 3 in the end time field 4033 of the processing log recording management table 403 (S2024), and proceeds to step S2025.

When an end condition is satisfied (S2025: YES), the CPU resource management unit 202 ends the processing illustrated in FIG. 9. When the end condition is not satisfied (S2025: NO), the CPU resource management unit 202 returns to step S2020.

FIG. 10 is an operation flow of the queue operation unit 203. The operation flow illustrated in FIG. 10 is called and executed in step S2021 described in FIG. 9.

The queue operation unit 203 determines whether or not the execution timing exceeds the original execution interval for the queue stored in the queue management table 405 (execution timing>execution interval) (S2030). That is, the queue operation unit 203 refers to the processing information management table 402 and the execution time field 4032 of the processing log recording management table, and checks whether or not the execution timing exceeds the execution interval (S2030).

When it is determined that the execution timing exceeds the execution interval (S2030: YES), the queue operation unit 203 operates the replacement flag field 4046 of the offset adjustment table 404, and proceeds to step S2031. When the execution timing does not exceed the execution interval (S2030: NO), the queue operation unit 203 ends the processing illustrated in FIG. 10.

The queue operation unit 203 checks the queue priority field 4026 of the processing information management table 402, and determines whether or not there is the task processing having priority lower than the priority (queue priority) of the task processing requiring a queue operation among the queues (task processing) managed in the queue management table 405 (S2031).

When the task processing having the lower priority than the task processing requiring the queue operation is stored in the queue (S2031: YES), the queue operation unit 203 replaces the order of the queue of the task processing requiring the queue operation and the queue of the task processing having the lower priority than the task processing (S2032), and ends the processing illustrated in FIG. 10. When there is no task processing having the lower priority than the task processing requiring the queue operation (S2031: NO), the queue operation unit 203 ends the processing illustrated in FIG. 10.

Figure 11:
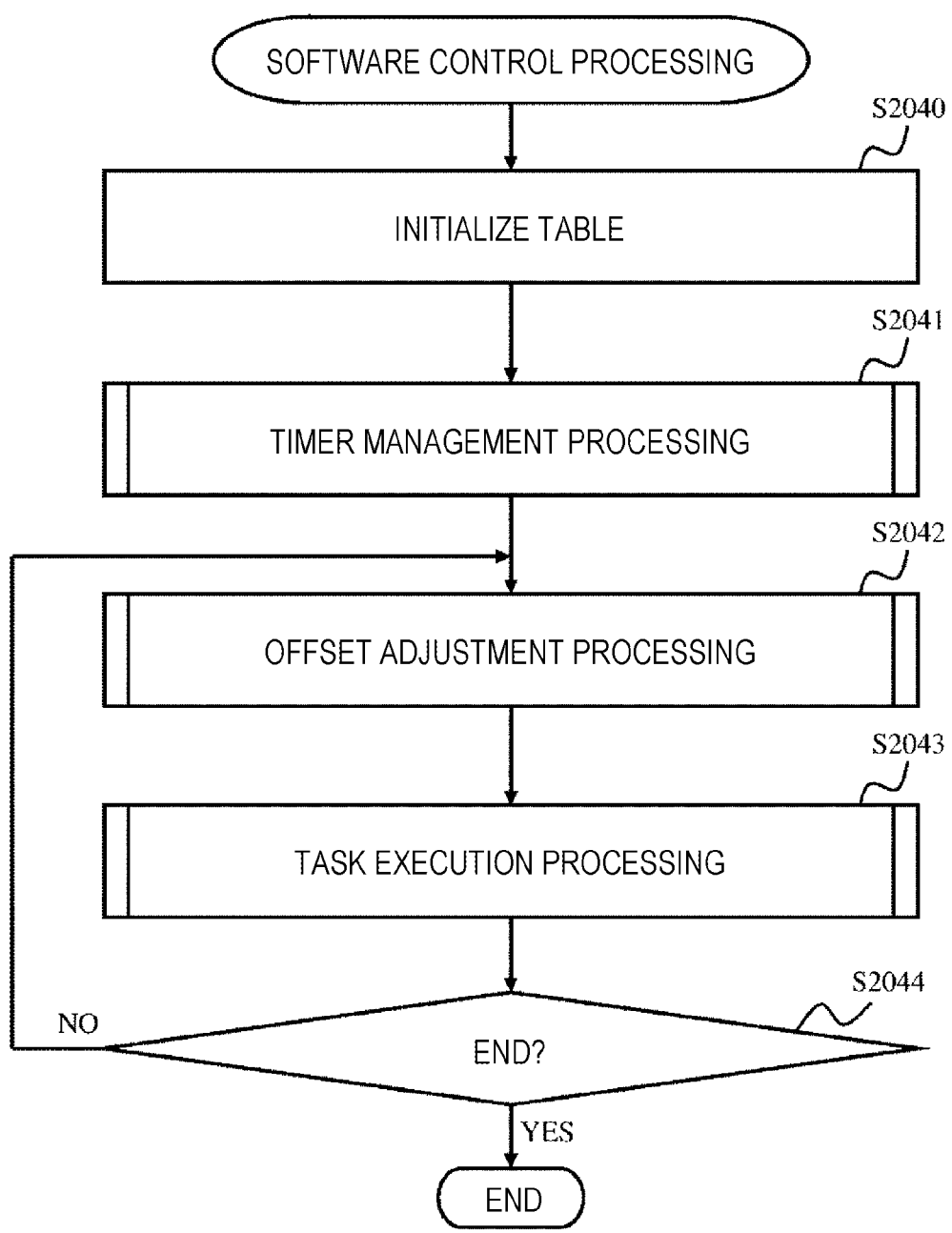
FIG. 11 is a diagram illustrating an example of an operation flow of a software control unit.

FIG. 11 is an operation flow of the software control unit 204. The software control unit 204 initializes the table stored in the data storage unit 4 (S2040), and calls the timer management unit 205 to be described below in FIG. 12 (S2041).

The software control unit 204 calls the offset adjustment unit 206 to be described below in FIG. 13 (S2042), further calls a task execution unit 9 to be described below in FIG. 16 (S2043), and then proceeds to step S2014.

The software control unit 204 determines whether or not the end condition is satisfied (S2044). When the end condition is satisfied (S2044: YES), the software control unit 204 ends the processing illustrated in FIG. 11. When the end condition is not satisfied (S2044: NO), the software control unit 204 returns to step S2042.

Figure 12:
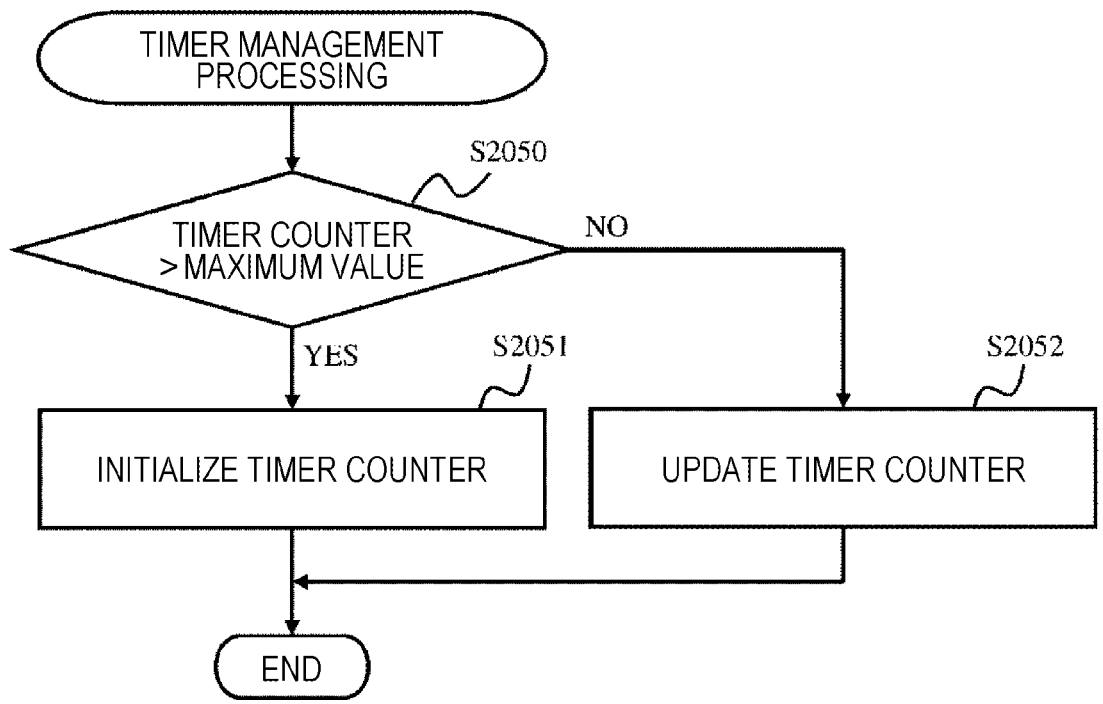
FIG. 12 is a diagram illustrating an example of an operation flow of a timer management unit.

FIG. 12 is an operation flow of the timer management unit 205. The timer management unit 205 acquires a timer counter and a maximum timer counter from the timer management table 401. The timer management unit 205 compares the value of the timer counter with the maximum timer counter, and determines whether or not the timer counter exceeds the maximum timer counter (S2050).

When the value of the timer counter exceeds the maximum timer counter (S2050: YES), the timer management unit 205 substitutes "0" for the value of the timer counter of the timer management table 401 (S2051), and ends the processing illustrated in FIG. 12.

When the value of the timer counter does not exceed the maximum timer counter (S2050: NO), the timer management unit 205 increments the value of the timer counter of the timer management table 401 by one (S2052), and ends the processing illustrated in FIG. 12.

Figure 13:
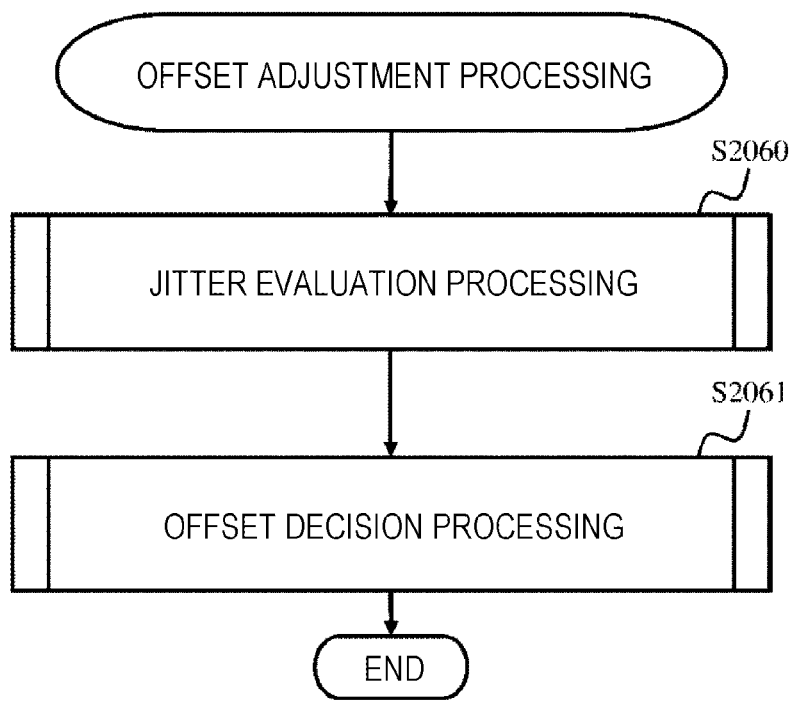
FIG. 13 is a diagram illustrating an example of an operation flow of an offset adjustment unit.

FIG. 13 is an operation flow of the offset adjustment unit 206. After the jitter evaluation unit 207 (S2060) to be described below in FIG. 14 and the offset decision unit 208 (S2061) to be described below in FIG. 15 are executed, the offset adjustment unit 206 ends the processing illustrated in FIG. 13.

Figure 14:
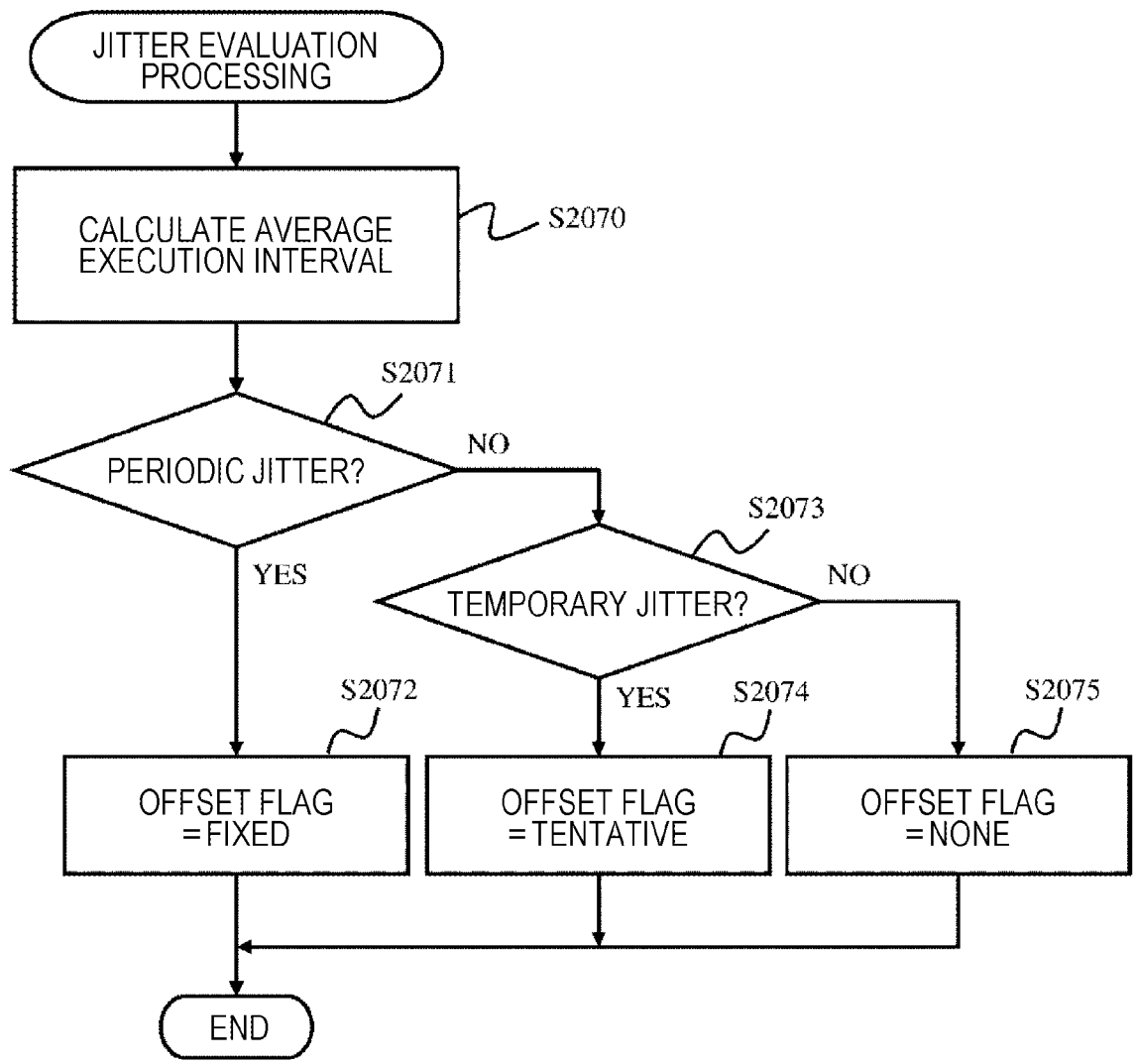
FIG. 14 is a diagram illustrating an example of an operation flow of a jitter evaluation unit.
Figure 15:
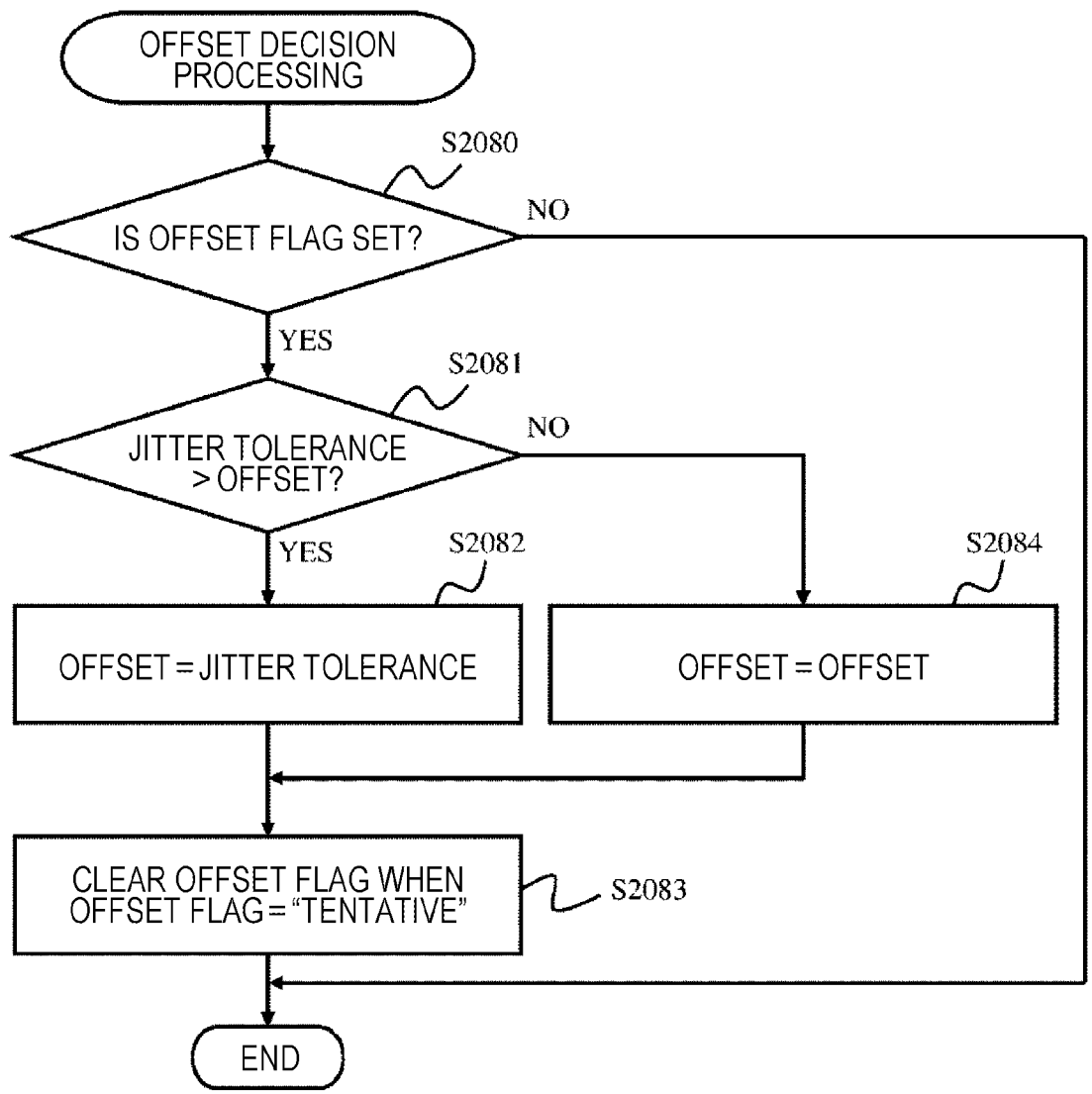
FIG. 15 is a diagram illustrating an example of an operation flow of an offset decision unit.

FIG. 14 is an operation flow of the jitter evaluation unit 207. The jitter evaluation unit 207 calculates an average execution interval from the value recorded in the processing log recording management table 403 (S2070). The average execution interval can be calculated as an average value of the execution intervals, but is not limited thereto. For example, an average value within a unit time or an average value for multiples number of times of execution immediately before the execution time may be used as the average execution interval.

The jitter evaluation unit 207 determines whether or not an evaluation target jitter generated in the task processing of which the offset is adjusted is the periodic jitter by comparing the average execution interval calculated in step S2070 with the jitter tolerance field 4025 of the processing information management table 402 (S2071).

When the value of the average execution interval is within the jitter tolerance, the jitter evaluation unit 207 determines that the evaluation target jitter is the periodic jitter (S2071: YES), and sets a value indicating "offset fixed" in the offset flag 4045 of the offset adjustment table 404 (S2072). The present processing illustrated in FIG. 14 ends.

When the average execution interval is out of the jitter tolerance field 4025 of the processing information management table 402 (S2071: NO), the jitter evaluation unit 207 determines that the evaluation target jitter is the temporary jitter (sporadic jitter) (S2073: YES). The jitter evaluation unit 207 sets a value indicating "tentative" in the offset flag 4045 of the offset adjustment table 404 (S2074), and ends the processing illustrated in FIG. 14.

When it is determined that the evaluation target jitter does not correspond to any of the periodic jitter and the temporary jitter (S2071: NO, S2073: NO), the jitter evaluation unit 207 clears the offset flag 4045 of the offset adjustment table 404 (S2075), and ends the processing illustrated in FIG. 14.

FIG. 15 is an operation flow of the offset decision unit 208. The offset decision unit 208 checks the offset flag 4045 of the offset adjustment table 404, and determines whether or not a value other than "0" is set in the offset flag 4045 (S2080). When the value other than "0" is not set in the offset flag 4045 (S2080: NO), that is, when the offset flag 4045 is not set, the offset decision unit 208 ends the processing illustrated in FIG. 15.

When the value other than "0" is set in the offset flag 4045 (S2080: YES), the offset decision unit 208 compares the calculated offset with the jitter tolerance, and determines whether or not the jitter tolerance is larger than the offset (S2081).

When the jitter tolerance is larger than the offset (S2081: YES), the offset decision unit 208 sets the jitter tolerance in the offset field 4043 of the offset adjustment table 404 (S2082).

The offset decision unit 208 refers to the offset flag 4045 of the offset adjustment table 404, clears the offset flag 4045 when "tentative" is set in the offset flag (S2083), and ends the processing illustrated in FIG. 15.

Meanwhile, when the jitter tolerance does not exceed the offset (S2081: NO), the offset decision unit 208 sets the offset calculated in step S2070 in FIG. 14 in the offset field 4043 of the offset adjustment table 404 (S2084), and proceeds to step S2082.

Figure 16:
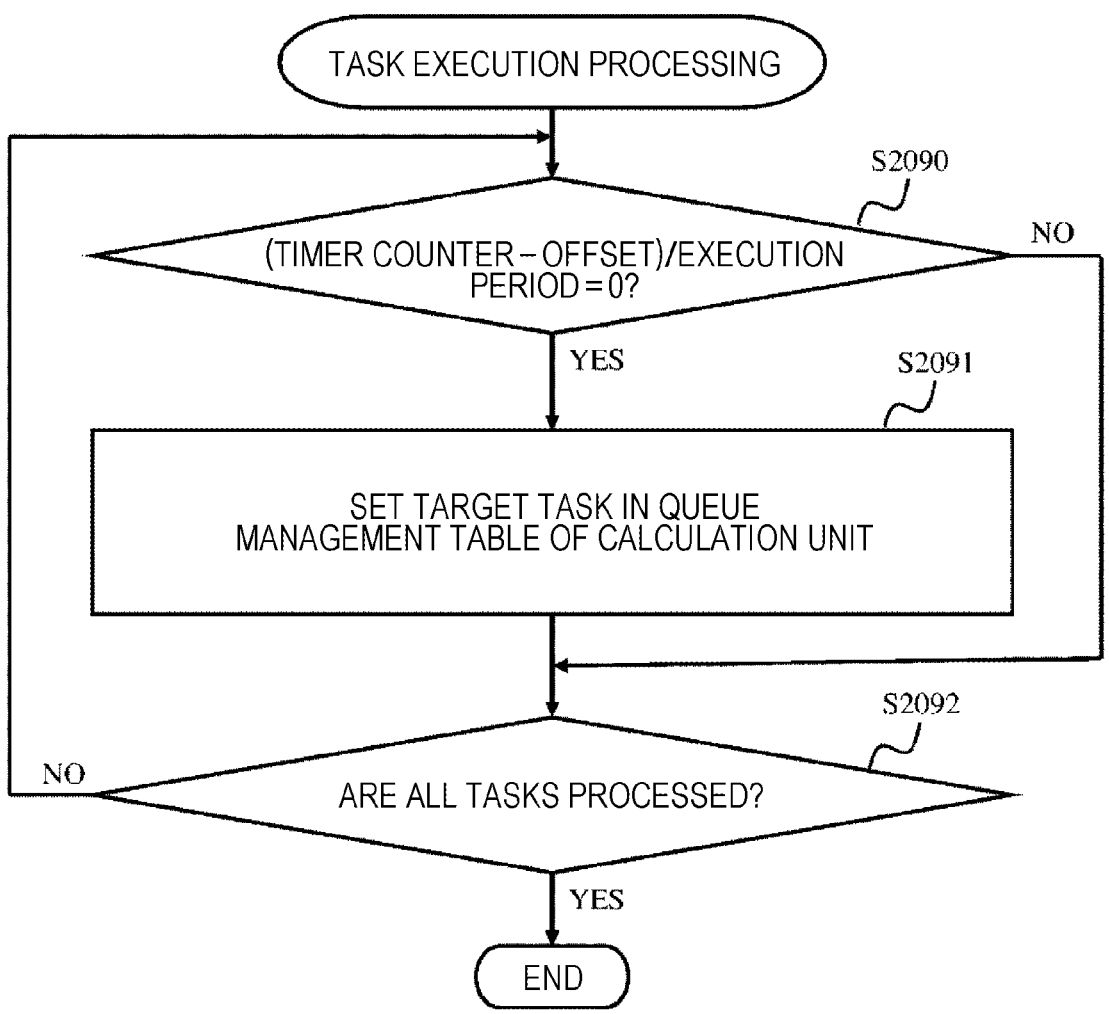
FIG. 16 is a diagram illustrating an example of an operation flow of a task execution unit.

FIG. 16 is an operation flow of the task execution unit 209. The task execution unit 209 refers to the timer management table 401, the processing information management table 402, and the offset adjustment table 404 for the target task processing, and calculates a result obtained by dividing a value obtained by subtracting the offset from the timer counter by the execution period of the target task processing.

When the calculation result for the target task processing is "0" (S2090: YES), the task execution unit 209 sets the target task processing in the queue management table 405 (S2091). In contrast, when the calculation result for the target task processing does not become "0" (S2090: NO), the task execution unit proceeds to step S2092.

The task execution unit 209 determines whether or not the aforementioned steps S2090 and S2091 are performed for all the task processing (S2092), and returns to step S2090 when unexecuted task processing remains (S2092: NO). When S2090 and S2091 are performed for all the task processing (S2092: YES), the task execution unit 209 ends the processing illustrated in FIG. 16.

As described in detail above, according to the present embodiment, the execution timing of the task processing to be adjusted in which the jitter is generated can be adjusted based on the jitter tolerance of the task processing to be adjusted, and safety and reliability can be improved with a simple configuration.

That is, according to the present embodiment, even though unintended high-priority processing occurs, it is determined whether the processing is the periodic processing or the temporary interrupt, and performs the adjustment of the execution timing or the replacement of the execution order. Thus, in the present embodiment, control can be stabilized even when the unintended high-priority processing occurs.

As a result, according to the present embodiment, even when the high-priority processing such as the interrupt processing occurs in an information processing system such as the vehicle control device in which software created by a supplier and software of an OEM operate in cooperation with each other, stable control can be realized, and reliability can be improved.

The above description is merely an example, and the interpretation of the present invention is not limited or restricted by the correspondence between the items described in the above embodiments and the items described in the claims.

The components of the present invention can be arbitrarily selected, and an invention having a selected configuration is also included in the present invention. The configurations described in the claims can be combined into combinations other than those specified in the claims.

REFERENCE SIGNS LIST 1 vehicle control device
2 program storage unit
3 calculation unit
4 data storage unit
5 interrupt controller
201 interrupt reception unit
202 CPU resource management unit
203 queue operation unit
204 software control unit
205 timer management unit
206 offset adjustment unit
207 jitter evaluation unit
208 offset decision unit
209 task execution unit

The invention claimed is:

1. A vehicle control device that controls a vehicle, the device comprising:
an execution management unit that manages execution of predetermined processing;
an execution state recording unit that records a history of execution states of the predetermined processing;
a setting information management unit that manages setting information related to the execution of the predetermined processing, the setting information including a jitter tolerance which is a tolerance of a jitter, wherein the execution management unit adjusts an execution timing of processing to be adjusted, which is included in the predetermined processing and in which the jitter is generated, based on the jitter tolerance of the processing to be adjusted; and
a jitter determination unit that determines whether the jitter generated in the processing to be adjusted is a periodic jitter generated periodically or a temporary jitter generated temporarily, wherein the execution management unit adjusts the execution timing of the processing to be adjusted based on the jitter tolerance based on a determination result of the jitter determination unit.

2. The vehicle control device according to claim 1, wherein, when the jitter determination unit determines that the jitter generated in the processing to be adjusted is the periodic jitter, the execution management unit adjusts the execution timing of the processing to be adjusted in correlation with the periodic jitter.

3. The vehicle control device according to claim 1, wherein, when the jitter determination unit determines that the jitter generated in the processing to be adjusted is the temporary jitter, the execution management unit temporarily adjusts the execution timing of the processing to be adjusted in correlation with the temporary jitter.

4. The vehicle control device according to claim 1, wherein the execution management unit replaces a next execution timing of the processing to be adjusted with an execution timing of another processing included in the predetermined processing according to the jitter generated in the processing to be adjusted and the execution timing of the processing to be adjusted.

5. The vehicle control device according to claim 4, wherein the execution management unit selects, as the other processing, processing having priority lower than priority set for the processing to be adjusted from the predetermined processing.

6. The vehicle control device according to claim 1, wherein the predetermined processing includes task processing and interrupt processing.

7. A vehicle control device that controls a vehicle, the device comprising:
an execution management unit that manages execution of predetermined processing;
an execution state recording unit that records a history of execution states of the predetermined processing;
a setting information management unit that manages setting information related to the execution of the predetermined processing, the setting information including a jitter tolerance which is a tolerance of a jitter, wherein the execution management unit adjusts an execution timing of processing to be adjusted, which is included in the predetermined processing and in which the jitter is generated, based on the jitter tolerance of the processing to be adjusted; and
a jitter determination unit that determines whether the jitter generated in the processing to be adjusted is a periodic jitter generated periodically or a temporary jitter generated temporarily,
wherein the execution management unit includes:
an execution timing adjustment unit that adjusts the execution timing of the processing to be adjusted based on the jitter tolerance based on a determination result of the jitter determination unit, and
an execution timing replacement unit that replaces an execution timing of the processing to be adjusted with an execution timing of another processing included in the predetermined processing according to the jitter generated in the processing to be adjusted and the execution timing of the processing to be adjusted.

8. A control method of a vehicle control device that controls a vehicle, wherein
the vehicle control device includes:
an execution management unit that manages execution of predetermined processing,
an execution state recording unit that records a history of execution states of the predetermined processing, and
a setting information management unit that manages setting information related to the execution of the predetermined processing, the setting information including a jitter tolerance which is a tolerance of a jitter, and the control method includes:
adjusting, by the execution management unit, an execution timing of processing to be adjusted, which is included in the predetermined processing and in which the jitter is generated, based on the jitter tolerance of the processing to be adjusted;
determining whether the jitter generated in the processing to be adjusted is a periodic jitter generated periodically or a temporary jitter generated temporarily; and
adjusting the execution timing of the processing to be adjusted based on the jitter tolerance based on a determination result of the jitter determination unit.

* * * * *